United States Patent
Tsai et al.

(10) Patent No.: US 8,362,505 B2
(45) Date of Patent: Jan. 29, 2013

(54) OPTICAL DEVICE AND THE FORMING METHOD THEREOF

(75) Inventors: Tzong-Liang Tsai, Taichung (TW); Lin-Chieh Kao, Taichung (TW); Shu-Ying Yang, Taichung (TW)

(73) Assignee: HUGA Optotech Inc., Taichung (TW)

( * ) Notice: Subject to any disclaimer, the term of this patent is extended or adjusted under 35 U.S.C. 154(b) by 182 days.

(21) Appl. No.: 12/408,795

(22) Filed: Mar. 23, 2009

(65) Prior Publication Data
US 2010/0193810 A1    Aug. 5, 2010

(30) Foreign Application Priority Data
Feb. 3, 2009   (TW) .............................. 98103349 A

(51) Int. Cl.
*H01L 33/00*   (2010.01)
(52) U.S. Cl. ................................ 257/98; 257/E33.068
(58) Field of Classification Search .................. 257/98, 257/E33.068, E33.069, 79
See application file for complete search history.

(56) References Cited

U.S. PATENT DOCUMENTS

| | | | | |
|---|---|---|---|---|
| 6,563,141 | B1 * | 5/2003 | Dawson et al. | 257/98 |
| 6,818,328 | B2 * | 11/2004 | Utsumi et al. | 428/690 |
| 7,663,153 | B2 * | 2/2010 | Huang et al. | 257/98 |
| 2007/0292978 | A1 * | 12/2007 | Yeh et al. | 438/22 |
| 2009/0032830 | A1 * | 2/2009 | Li | 257/98 |

* cited by examiner

*Primary Examiner* — Jerome Jackson, Jr.
*Assistant Examiner* — Yu Chen
(74) *Attorney, Agent, or Firm* — Jianq Chyun IP Office

(57) ABSTRACT

An optical device is provided which includes a first electrode; a substrate disposed on the first electrode; a multi-layer structure disposed on the substrate, and the multi-layer structure consisted of a plurality of insulating layers with different refractive indices formed alternately; a first conductive semiconductor layer disposed on the substrate to cover the multi-layer structure; an active layer disposed on the first conductive semiconductor layer; a second conductive semiconductor layer disposed on the active layer; a transparent conductive layer disposed on the second conductive semiconductor layer; and a second electrode disposed on the transparent conductive layer, thereby, the multi-layer structure can increase the light reflective effect or anti-reflective effect within the optical device to improve the light emitting-efficiency.

9 Claims, 12 Drawing Sheets

OPTICAL DEVICE AND THE FORMING METHOD THEREOF

BACKGROUND OF THE INVENTION

1. Field of the Invention

The present invention is an optical device, and more particularly is to form a multi-layer structure over the substrate to increase the light reflective efficiency of the optical device.

2. Description of the Prior Art

The conventional light emitting diode (LED) as shown in FIG. 1A and FIG. 1B comprises a substrate 100, a buffer layer 102, a multi-layer structure, a transparent conductive layer 110 and two electrodes 112, 114. The multi-layer structure includes an active layer 106 between the N-type semiconductor layer 104 and the P-type semiconductor layer 108. The active layer 106 is a single-layer structure or a multi-layer structure made by a reactive nitrogen semiconductor compound. The voltage inputted between the electrodes 112, 114 of the LED will generate electrons and/or holes injecting into the N-type semiconductor layer 104 and P-type semiconductor layer 108 and passing through the active layer 106. The electrons and the holes will rejoin in the active layer 106 to generate light. The light generated in the illuminant layer will transmit to anywhere and release at the exposed surfaces of the LED. In order to generate the light, the light should be rejected at the predetermined direction.

Generally, the illuminant efficiency of the LED is based some parameters calculated at the LED. One is the light collection efficiency, which is the ratio of the light transmitted from the LED and the light generated by the LED. Practically, because of the absorption of the different layers within the LED, the light transmitted from the LED is less than the light generated by the LED. In order to increase the light collection efficiency, a reflective layer is added within the multi-layer structure of the LED in prior art to guide the light to transmit in the desired direction.

In order to improve the crystallized quality of the GaN compound layer, the problem of the lattice between the sapphire and the active layer of the GaN compound layer is needed to be solved. Therefore, in prior art, as shown in FIG. 1A and FIG. 1B, a buffer layer 102 made by MN is formed between the substrate 100 and the N-type semiconductor layer 104. The crystal structure of the buffer layer 102 is non-single crystal such as microcrystal or polycrystal. The crystal structure of the buffer layer 102 is able to solve the problem of the crystal mismatching between the GaN compound layers. However, the prior art described above, the refractive index generated by the light in the active layer restrains the illuminant efficiency of the optical device.

SUMMARY OF THE INVENTION

According to the problems described above, the main object of the present invention is to use the insulating material layer forming multi-layer structure on the substrate to reduce dislocation and generate the reflective layer and anti-reflective layer by the multi-layer structure to enhance the illuminant efficiency.

According to the object described above, the present invention discloses an optical device includes a first electrode; a plurality of multi-layer structures disposed on the substrate, wherein the multi-layer structure is consisted of at least two insulating layers with different refractive indices formed alternately; a first conductive semiconductor layer disposed on the substrate to cover the multi-layer structure; an active layer disposed on the first conductive semiconductor layer; a second conductive semiconductor layer disposed on the active layer; and a transparent conductive layer disposed on the second conductive semiconductor layer.

The present invention also discloses an optical device including a substrate; a plurality of multi-layer structure disposed on the substrate and arranged separately from each other on the substrate, wherein each of the multi-layer structure is consisted of a plurality of insulating layers stacked together, the insulating layers have different refractive indices and the refractive indices of the insulating layers are consecutively increasing from the lowermost insulating layer to the uppermost insulating layer; a first conductive semiconductor layer disposed on the substrate to cover the multi-layer structure, wherein the first conductive semiconductor layer includes a first region and a second region; an active layer disposed on the first conductive semiconductor layer; a second conductive semiconductor layer disposed on the active layer; a transparent conductive layer disposed on the second conductive semiconductor layer; and a first electrode disposed on the first region of the first conductive semiconductor layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
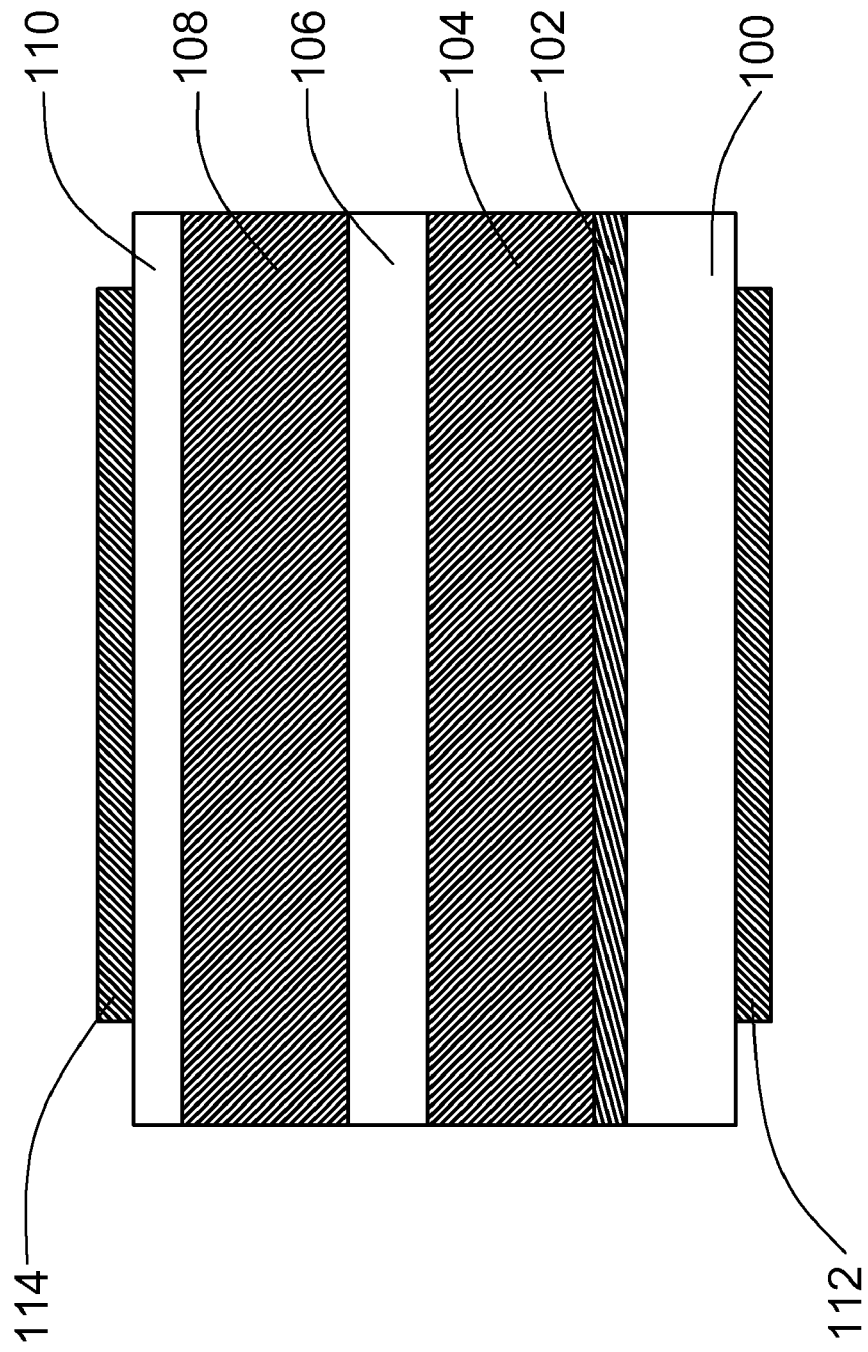
FIG. 1A and FIG. 1B are views illustrating the conventional structure of the optical device.
Figure 1B:
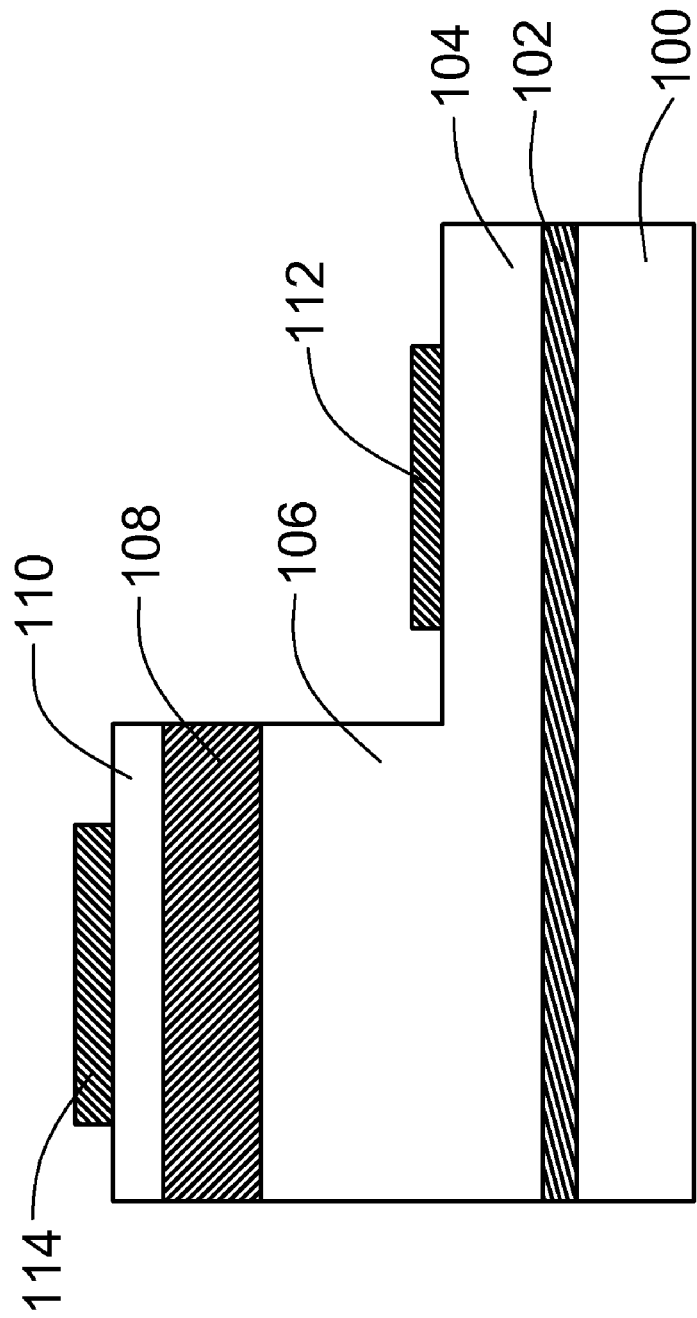
Figure 2A:
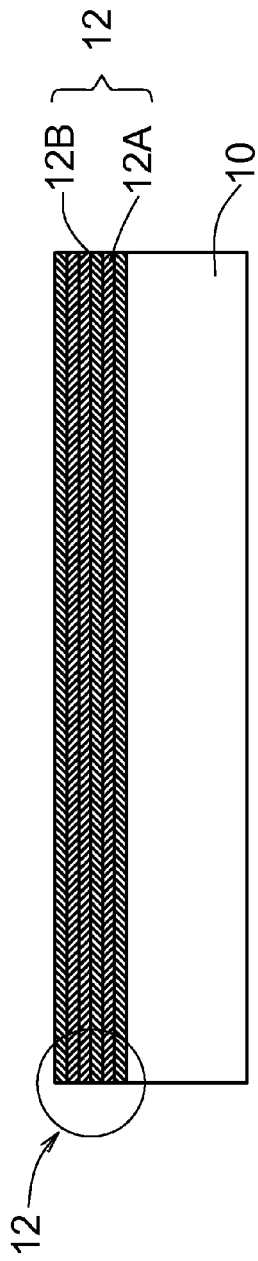
FIG. 2A to FIG. 2H are views illustrating the steps of forming the multi-layer structure in the optical device.

FIG. 2A-FIG. 2H are views showing an embodiment of the optical device in the present invention. Now referring to FIG. 2A, it is a view showing that a plurality of multi-layer structures formed on the substrate. As shown in FIG. 2A, a substrate 10, such as a substrate made by sapphire, is provided. A conventional semiconductor process is used to form a first insulating layer 12A on the top surface of the substrate 10 and form a second insulating layer 12B on the first insulating layer 12A. In this embodiment, the purpose to form the multi-layer structures 10 before a buffer layer (not shown) is formed on the substrate 10 is to have the effect of the reflector and anti-reflector by interlacedly stacking the first insulating layer 12A and the second insulating layer 12B and the reflective efficiency and anti-reflective efficiency of the light within the optical device will enhance. Therefore, a plurality of multi-layer structures formed on the substrate 10 are used to substitute the conventional $SiO_2$ single-layer film used by the lateral epitaxial overgrowth to increase the reflective efficiency and the anti-efficiency of the light in the optical device so as to enhance the illuminant efficiency of the optical device.

Figure 2B:
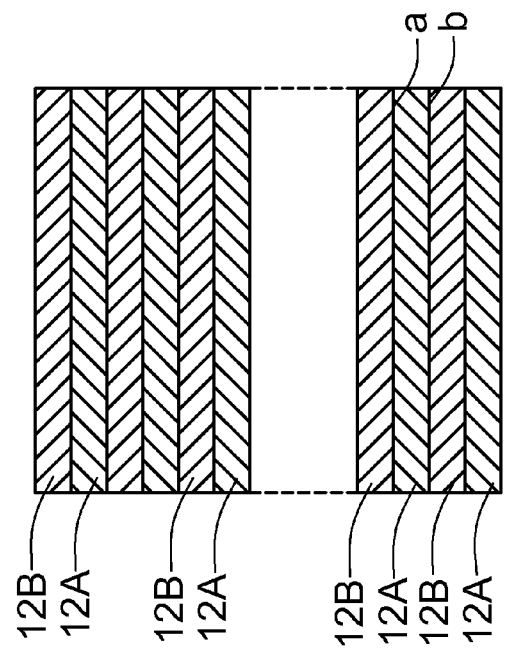

It should be noted that, in one embodiment, each of the multi-layer structures 12 is made by at least two insulating layers 12A and 12B with different refractive index coefficients and the insulating layers 12A and 12B are interlacedly stacking, as shown in FIG. 2B. In FIG. 2B, $n_1$ is the refractive index coefficient of the first insulating layer 12A and n2 is the refractive index coefficient of the second insulating layer 12B, and n1 and $n_2$ are different. a and b are the interfaces of the insulating layers. As shown in FIG. 2B, the refractive index coefficient in a interface is Ra and $Ra=(n_2-n_1)/(n_1+n_2)$ and the refractive index coefficient in b interface is $Rb=(n_1-n_2)/(n_1+n_2)$. As the description above, $Ra=-Rb$. Therefore, the phase difference of the reflective light between a interface and b interface is 180 degree.

If the thickness in each of the multi-layer structures is $\lambda/4$ ($\lambda$ is the symbol of wavelength), the thickness of the film is the product of the refractive index coefficient and the wavelength. Therefore, the thickness of the first insulating layer 12A is $n_1 \times \lambda/4$ and the thickness of the second insulating layer 12B is $n_2 \times \lambda/4$. Therefore, as the description above, the reflective waves in the adjacent interfaces will have 180 degree phase difference. After all the phase differences are added together, the wavelengths of the reflective waves in the adjacent interface are the same and it would have the constructive interference. Because of this characteristic, the multi-layer structures are used to be the mirror. On the contrary, if the thickness in each of the multi-layer structures (such as 12A, 12B and so on) is ½ wavelength and the thicknesses of the thin films in each of the multi-layer structures are $n_1 \times \lambda/2$ and $n_2 \times \lambda/2$, the reflective waves in the adjacent interfaces are different and the phase different is 180 degree. Because the adjacent interface will have constructive interference, the multi-layer constructors are used to be the anti-reflective layer or the reflective layer.

Therefore, in the embodiment of the present invention, the refractive index coefficient of the first insulating layer 12A is higher than the refractive index coefficient of the second insulating layer 12B. However, in a different embodiment, the refractive index coefficient of the first insulating layer 12A could be lower than the refractive index coefficient of the second insulating layer 12B.

Figure 2C:
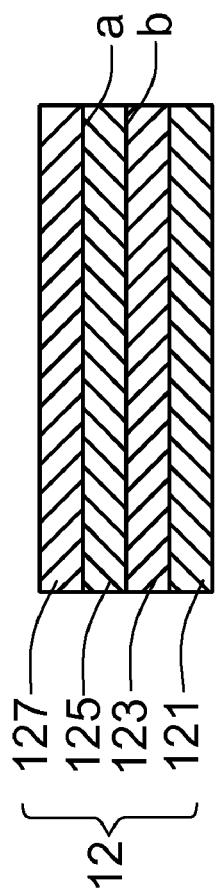

Therefore, the multi-layer structure 12 is made by the first insulating layer 12A with low refractive index and the second insulating layer 12B with high refractive index or the first insulating layer 12A with high refractive index and the second insulating layer 12B with low refractive index. The first insulating layer 12A and the second insulating layer 12B are interlacedly stacking, as shown in FIG. 2B. In another embodiment, the multi-layer structure 12 is made by a plurality of insulating layers 121, 123, 125 and 127 and the insulating layers 121, 123, 125 and 127 are stacking according to their refractive indices, as shown in FIG. 2C. The refractive indices of the multi-layer structure 12 made by insulating layers 121, 123, 125 and 127 are between the refractive indices of the first conductive semiconductor layer 32 and the substrate 10.

Besides, in the embodiments of the present invention, the materials of the insulating layers are selected from the group consisting of: $SiO_x$, $Si_xN_y$, $SiO_xN_y$, ZnSe, $TiO_2$ and $Ta_2O_2$. The material of the substrate 10 is selected from the group consisting of: $MgAl_2O_4$, GaN, AlN, SiC, GaAs, AlN, GaP, Si, Ge, ZnO, MgO, LAO, LGO and glasses.

Figure 2D:
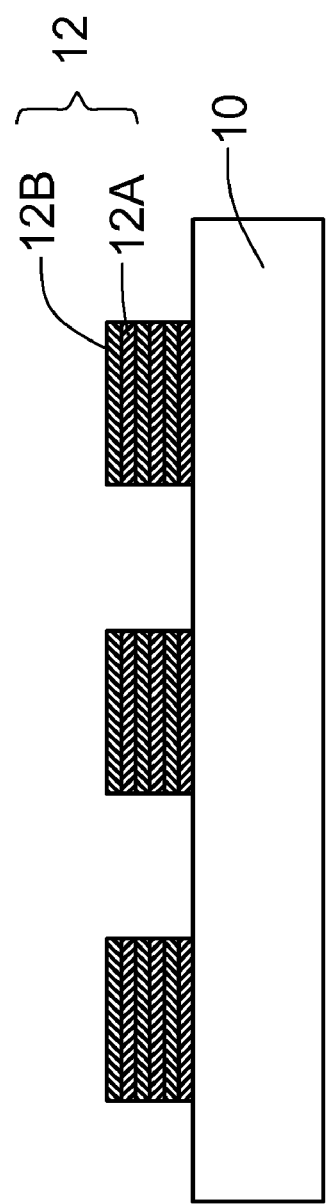

Now, the following steps are based on the multi-layer structures 12 with at least two insulating layers 12A and 12B. First of all, by the semiconductor process technology, such as photo-lithography and etching process, a patterned photoresist layer (not shown) is formed on the second insulating layer 12B and an etching process is sequentially used on the second insulating layer 12B and the first insulating layer 12A so as to remove a portion of the second insulating layer 12B and the first insulating layer 12A to expose a portion of the top surface of the substrate 10, as shown in FIG. 2D.

Figure 2E:
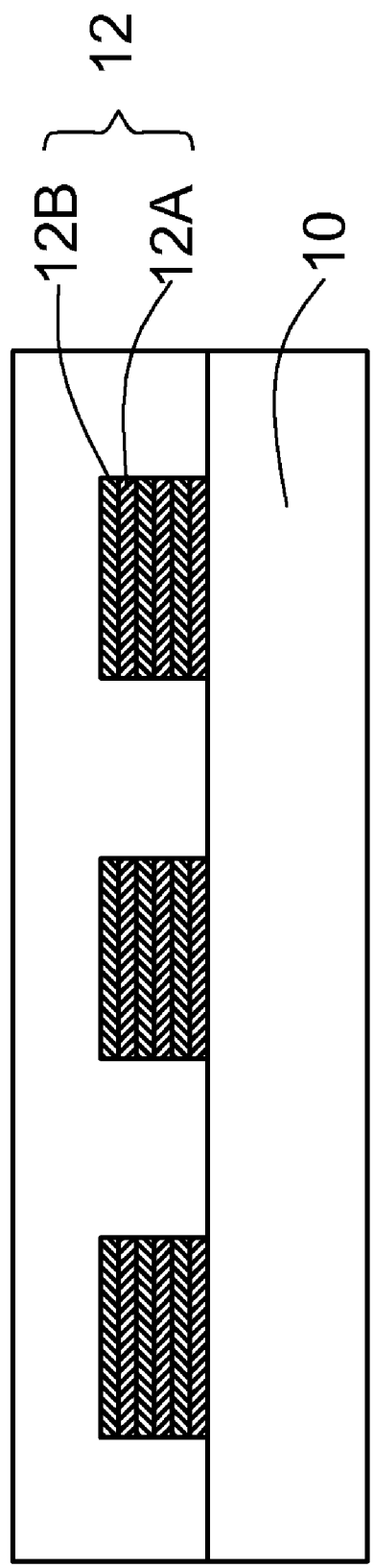

Now, referring to FIG. 2E, FIG. 2E is a view showing that a buffer layer formed on the substrate and the multi-layer structure. The substrate 10 with the multi-layer structure 12 is installed into a MOVPE (metalorganic vapour phase epitaxy) reactive container, and a buffer layer 20 is formed on the substrate 10. The buffer layer 20 is a multi-strain releasing layer structure and used to get a high quality GaN layer. In the present embodiment, the buffer layer 20 is made by a compound layer (not shown) and an III-V group compound layer. The compound layer is made by GaN, such as AlGaN.

Figure 2F:
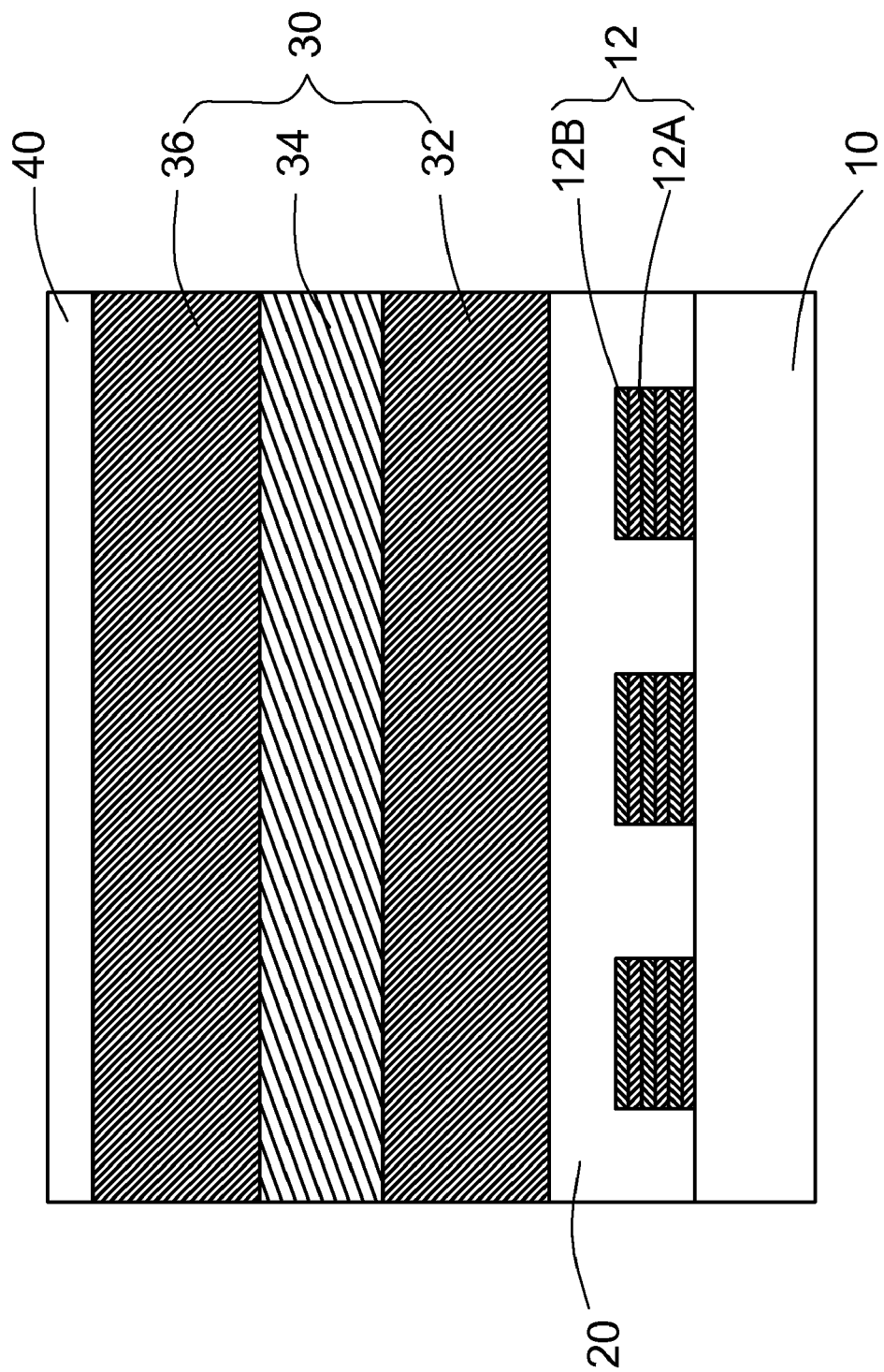

Please refer to FIG. 2F, it is a view showing that a semiconductor epi-stacked structure is formed on the buffer layer. As shown in FIG. 2F, a semiconductor epi-stacked structure 30 is formed on the buffer layer 20 and includes a first conductive semiconductor layer 32 formed on the buffer layer 20, an active layer 34 formed on the first conductive semiconductor layer 32 and a second conductive semiconductor layer 36 formed on the active layer 34. The first conductive semiconductor layer 32 and the second conductive semiconductor layer 36 is compound conductive semiconductor layer made by III-V group material, such as Nitrogen semiconductor layer. Besides, the doping type of the first conductive semiconductor layer 32 is different from the doping type of the second conductive semiconductor layer 36. For example, when the first conductive semiconductor layer 32 is an N-type conductive semiconductor layer, the second conductive semiconductor layer 36 must be P-type conductive semiconductor layer. It is very clear to know that the active layer 34 is formed between the N-type conductive semiconductor layer and the P-type conductive semiconductor layer. The electrons and holes between the N-type conductive semiconductor layer and the P-type conductive semiconductor layer will be driven to the active layer 34 by adding some voltage and the recombination is generated to emit the light.

Therefore, as the description above, first conductive semiconductor layer 32 and the second conductive semiconductor layer 36 can be N-type conductive semiconductor layer or P-type conductive semiconductor layer in the semiconductor epi-stacked structure 30 of the optical device of the present invention. In the embodiment of the present invention, when the second conductive semiconductor layer 36 is P-type conductive semiconductor layer, the first conductive semiconductor layer 32 must be a N-type conductive semiconductor layer and vice versa. The semiconductor epi-stacked structure 30 of the optical device disclosed in the present invention can be a conventional semiconductor epi-stacked structure such as, light emitting diode (LED), laser, photo-detector or VCSEL (vertical-cavity surface emitting laser).

Now, referring to FIG. 2F, there is a transparent conductive layer 40 formed on the semiconductor epi-stacked structure 30. A first electrode 50 and a second electrode 60 are formed on the structure. After the semiconductor epi-stacked structure 30 is formed on the buffer layer 20, the temperature of the reactive container is reduced to the room temperature and the semiconductor epi-stacked structure die is taken out from the reactive container. Therefore, the transparent conductive layer 40 is formed on the surface of the second conductive semiconductor layer 36 of the semiconductor epi-stacked structure 30. The material of the transparent conductive layer 40 may be Ni/Au, NiO/Au, Ta/Au, TiWN, TiN, Indium Tin Oxide (ITO), Antimony Doped Tin Oxide (ATO), AZO or $Zn_2SnO_4$, and for example, a thickness of the transparent conductive layer 40 made of ITO is about 2500 Å.

Figure 2G:
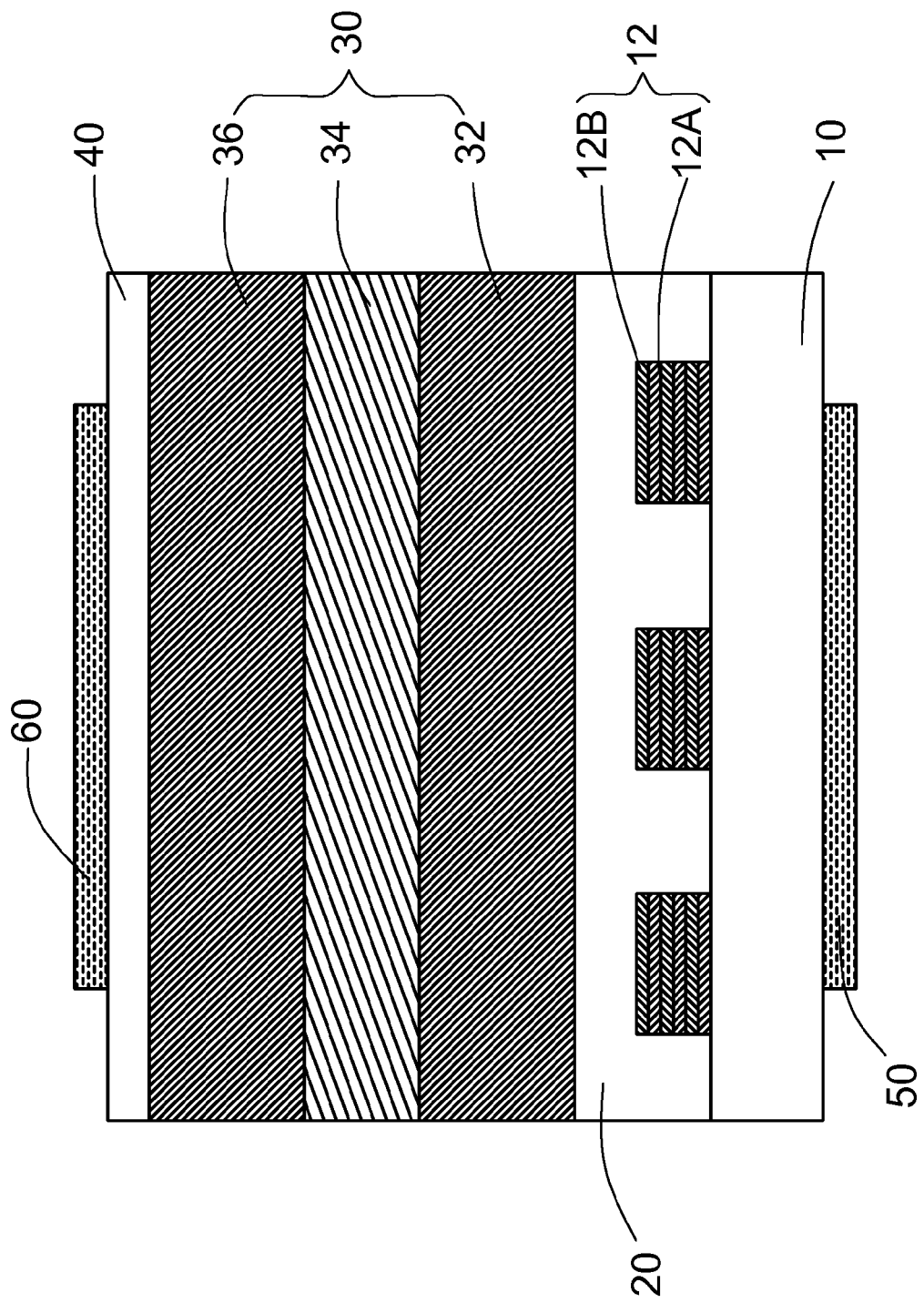
Figure 2H:
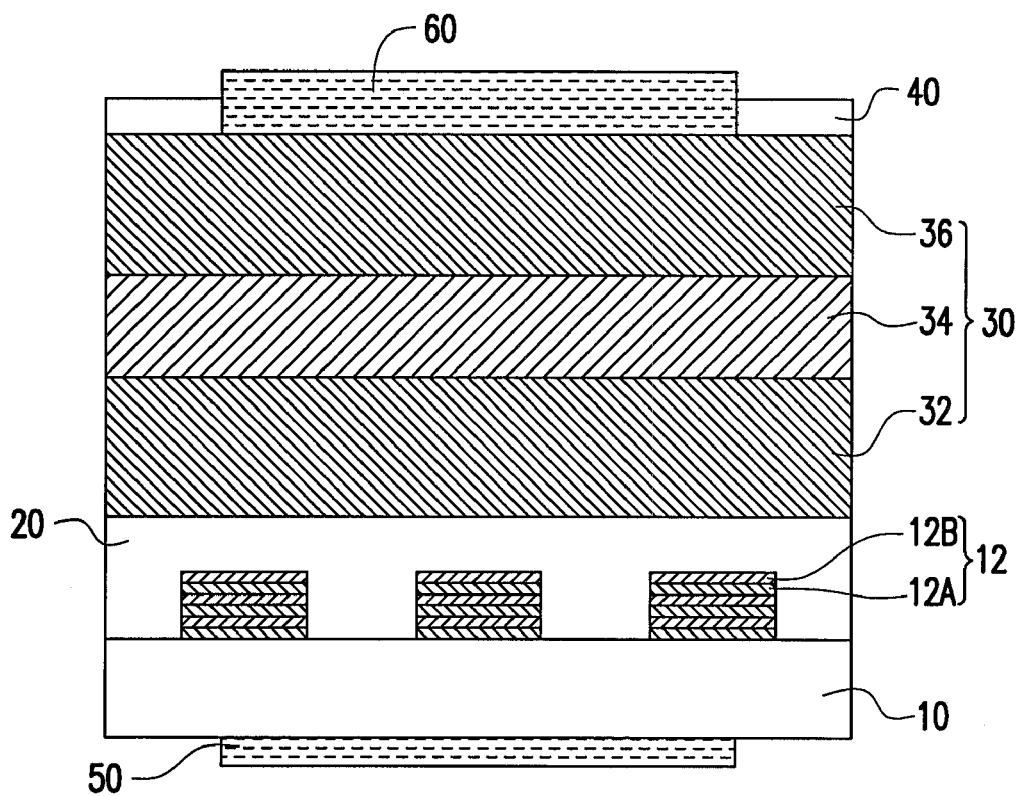

Please refer to FIG. 2G and FIG. 2H. FIG. 2G and FIG. 2H which are views showing that a first electrode 50 and a second electrode 60 are formed on the structure shown in FIG. 2F. The second electrode 60 is formed on the transparent conductive layer 40. In the present invention, the second conductive semiconductor layer 36 is a P-type nitrogen conductive semiconductor layer, so the material of the second electrode 60 is Au/Ge/Ni, Ti/Al, Ti/Au, Ti/Al/Ti/Au, Cr/Au or a compound thereof.

Therefore, according to the description above, the optical device is formed. It should be noted that manufacture process of the first electrode 50 and the second electrode 60 is well know in the conventional art, therefore the detail description of the manufacture process is omitted herein.

In another embodiment, there is a photoresist layer (not shown) formed on the transparent conductive layer by using a semiconductor process. A lithography process, such as etching step, is used to remove a portion of the transparent conductive layer 40 to expose a portion of the surface of the second conductive semiconductor layer 36 to remove the photoresist layer. The material of the second electrode 60 is Au/Ge/Ni, Ti/Al, Ti/Au, Ti/Al/Ti/Au, Cr/Au or an ally thereof. The first electrode 50 is formed on the bottom surface of the substrate 10. The material of the first electrode 50 is Au/Ge/Ni, Ti/Al, Ti/Au, Ti/Al/Ti/Au, Cr/Au ally or W/Al alloy. Therefore, according to the description above, the optical device is formed. It should be noted that manufacture process of the first electrode 50 and the second electrode 60 is well know in the conventional art, therefore the detail description of the manufacture process is omitted herein.

Therefore, as the description above, no matter the optical device is made by the insulating layers 121, 123, 125 and 127 respectively stacking from bottom to top in accordance with the refractive indices or at least two multi-layer structures 12 with different refractive indices, because of the multi-layer structure with high refractive indices, a flip-chip method is used in the semiconductor process to turn over the optical device and the optical device is electrically connected to another circuit board (not shown) to complete the packing process of the optical device.

Figure 3A:
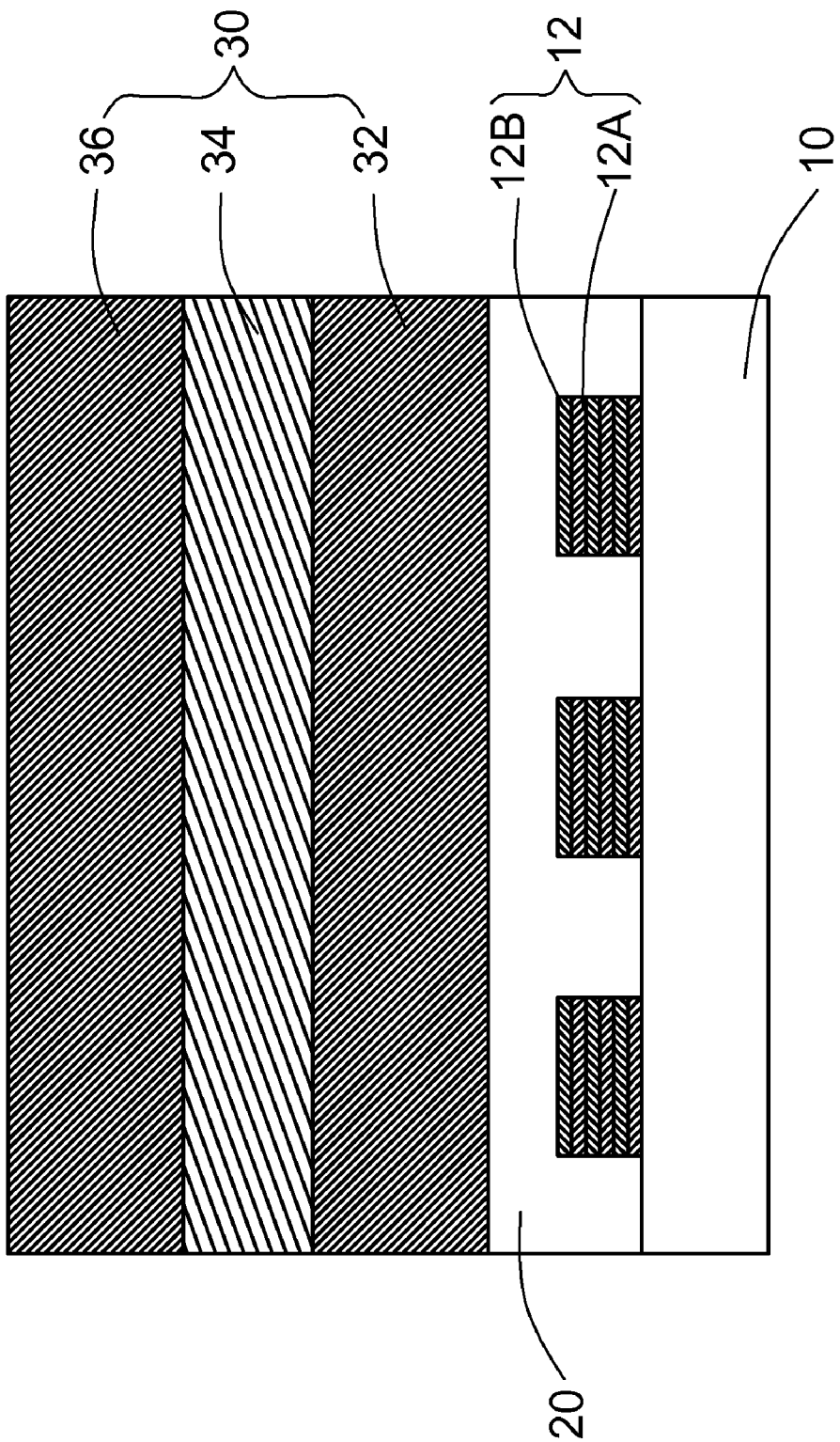
FIG. 3A to FIG. 3D are views illustrating the steps of forming the multi-layer structure in the optical device of another embodiment.

FIGS. 3A-FIG. 3D are views showing the steps to enhance the illuminant efficiency of the optical device with multi-layer structure. As shown in FIG. 3A, a multi-layer structure 12, a buffer layer 20, and semiconductor epi-stacked structure 30 are formed on the substrate 10. The steps of forming the multi-layer structure 12, the buffer layer 20, and semiconductor epi-stacked structure 30 are the same as the description above, so the detail descriptions are omitted therein.

It should be noted that the multi-layer 12 is made by a plurality of insulating layers 121, 123, 125 and 127 in an embodiment and they are respectively stacking from bottom to top in accordance with the refractive indices, as shown in FIG. 2C. Therefore, the refractive indices of the insulating layers 121, 123, 125 and 127 of the multi-layer structure 12 are between the refractive indices of the first conductive semiconductor layer 32 and the substrate 10.

Figure 3B:
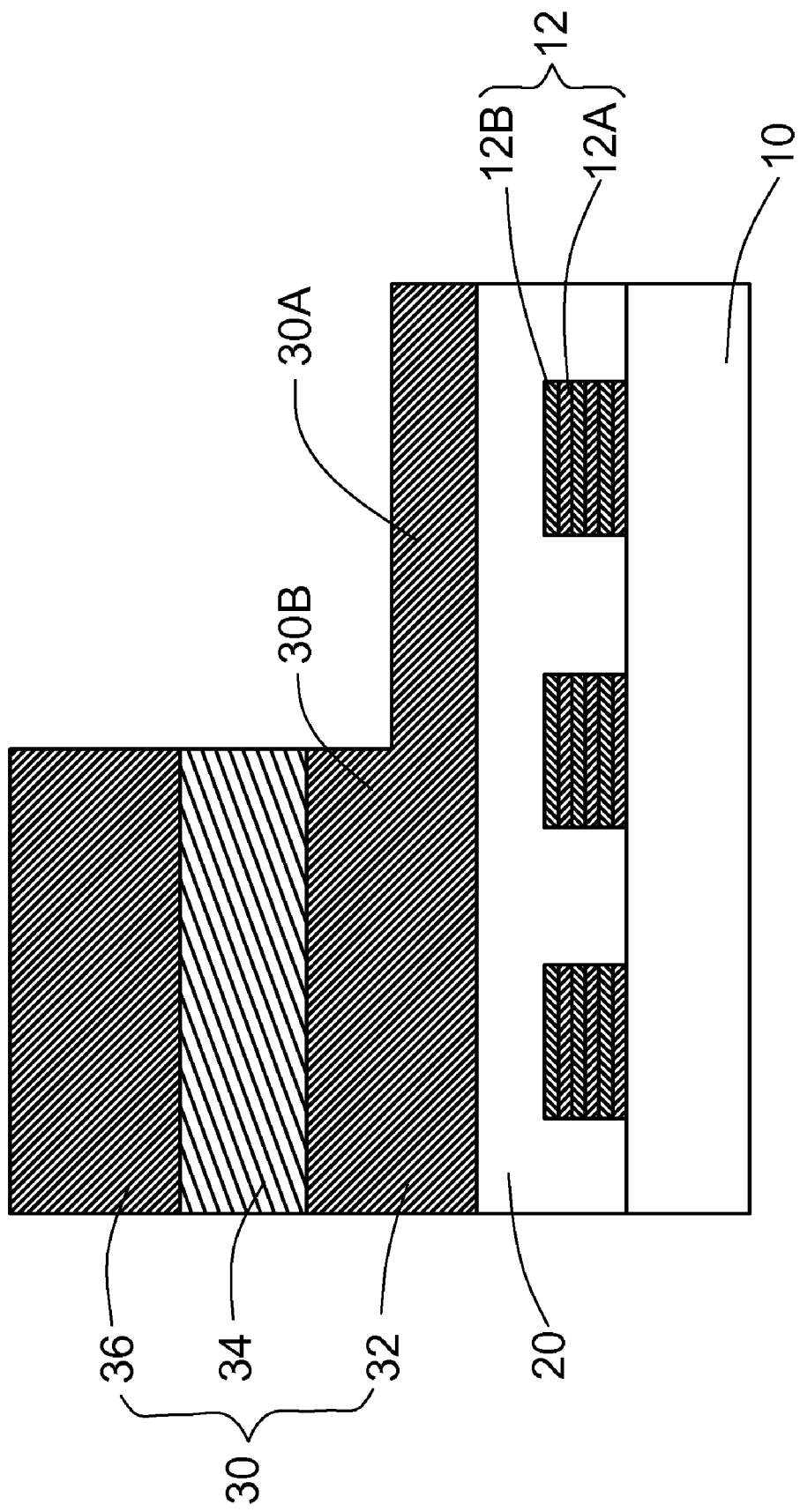

FIG. 3B is a view showing that a first region and a second region of the semiconductor epi-stacked structure 30 on the buffer layer 20. As shown in FIG. 3B, a lithography process or an etching process is used to form a patterned photoresist layer (not shown) on the second conductive semiconductor layer 36 of the semiconductor epi-stacked structure 30. Then, the etching process is used to remove a portion of the conductive semiconductor layer 36, the active layer 34 and the first conductive semiconductor layer 32 to expose a portion of the surface of the first conductive semiconductor layer 32 to form a semiconductor epi-stacked structure 30 with a first region 30A (the exposed portion of the first conductive semiconductor layer 32) and the second region 30B (the region covered by the active layer 34 and the second conductive semiconductor layer 36).

Figure 3C:
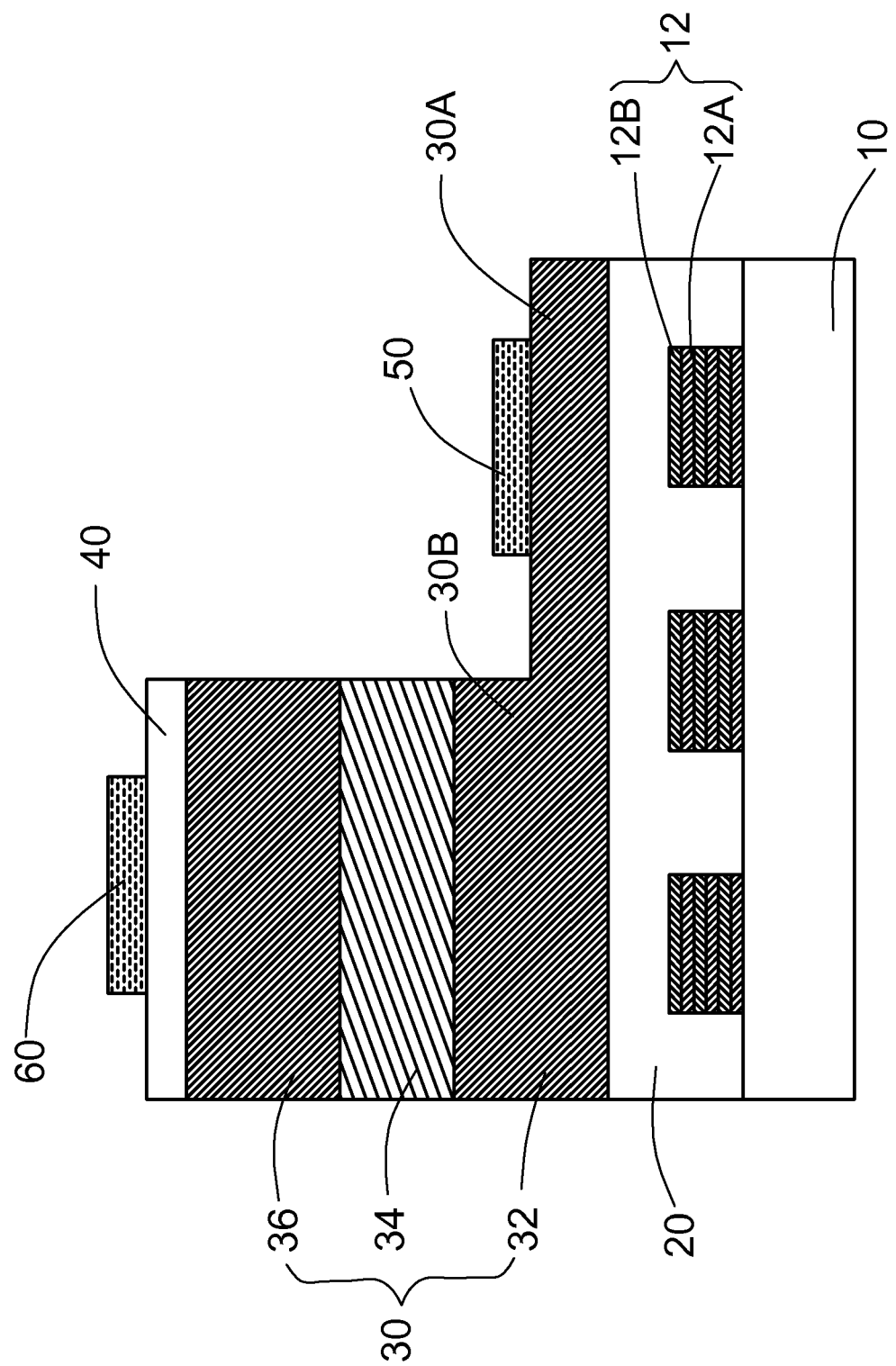
Figure 3D:
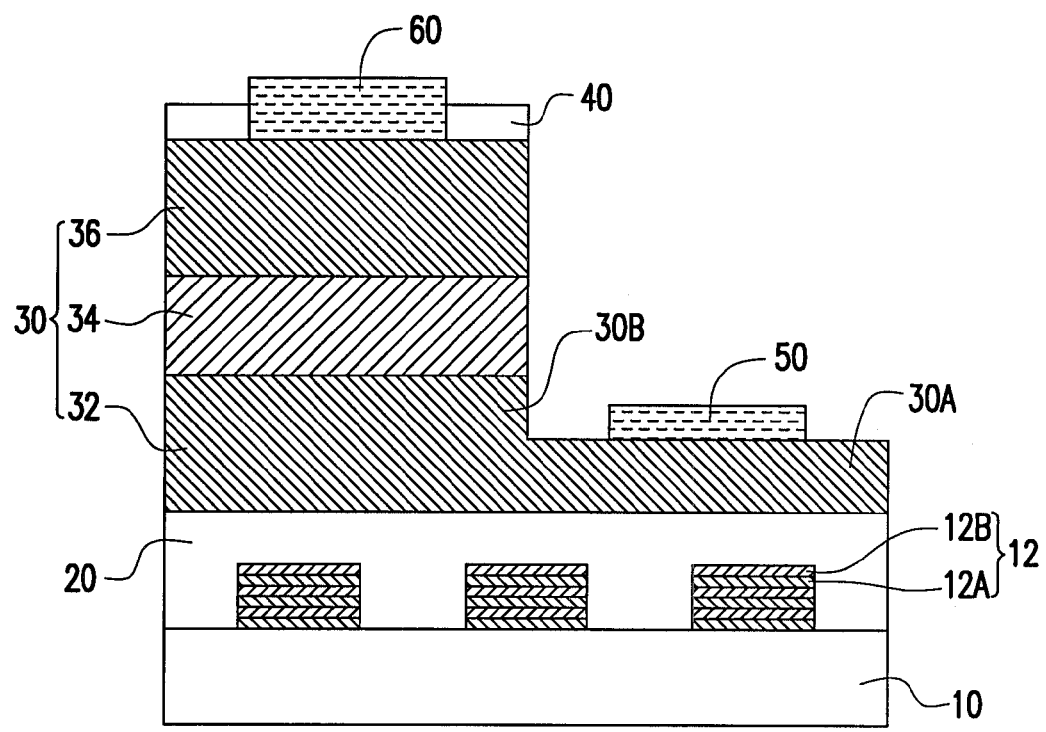

FIGS. 3C and 3D are views showing that a first electrode and a second electrode of the transparent conductive layer are formed on the lateral epitaxial structure. Similarly, a transparent conductive layer 40 is formed on the second conductive semiconductor layer 36 of the second region 30B of the lateral epitaxial structure 30. After the semiconductor epi-stacked structure 30 is formed on the buffer layer 20, the temperature of the reactive container is reduced to the room temperature and the semiconductor epi-stacked structure die is taken out from the reactive container. Therefore, the transparent conductive layer 40 is formed on the surface of the second conductive semiconductor layer 36 of the semiconductor epi-stacked structure 30. The material of the transparent conductive layer 40 may be Ni/Au, NiO/Au, Ta/Au, TiWN, TiN, Indium Tin Oxide (ITO), Antimony Doped Tin Oxide (ATO), AZO or $Zn_2SnO_4$, and for example, a thickness of the transparent conductive layer 40 made of ITO is about 2500 A.

Please refer to FIGS. 3C and 3D. The views show that the first electrode 50 is formed on the first region 30A of the first conductive semiconductor layer 32 and the second electrode 60 is formed on the transparent conductive layer 40 to complete the optical device structure. In a different embodiment, there is a photoresist layer (not shown) formed on the transparent conductive layer 40 by using a semiconductor process. A lithography process, such as etching step, is used to remove a portion of the transparent conductive layer 40 to expose a portion of the surface of the second conductive semiconductor layer 36 to remove the photoresist layer. The material of the second electrode 60 is Au/Ge/Ni, Ti/Al, Ti/Au, Ti/Al/Ti/Au, Cr/Au or an ally thereof. The first electrode 50 is formed on the first region 30A of the first conductive semiconductor layer 32. The material of the first electrode 50 is Au/Ge/Ni, Ti/Al, Ti/Au, Ti/Al/Ti/Au, Cr/Au ally or W/Al ally. Therefore, according to the description above, the optical device is formed. It should be noted that manufacture process of the first electrode 50 and the second electrode 60 is well know in the conventional art, therefore the detail description of the manufacture process is omitted herein.

The purpose of forming the multi-layer structure 12 on the substrate 10 is to let the insulating layer 12A and 12B be a reflective mirror or anti-reflective layer because the insulating material layers 12A and 12B are interlacedly stacking with reflective or anti-reflective ability.

Therefore, the reflective or anti-reflective efficiency of the optical device (as shown in FIG. 2E and FIG. 3C) is enhanced. Therefore, a plurality of multi-layer structures are to replace the conventional single layer SiO to increase the reflective or anti-reflective efficiency of the light in the device and the illuminant efficiency of the optical device is enhanced.

Therefore, no matter the optical device is made by the insulating materials 121, 123, 125 and 127 respectively stacking from bottom to top in accordance with the refractive indices or at least two multi-layer structures 12 with different refractive indices, because of the multi-layer structure with high refractive indices, a flip-chip method is used in the semiconductor process to turn over the optical device and the optical device is electrically connected to another circuit board (not shown) to complete the packing process of the optical device.

What is claimed is:
1. An optical device, comprising:
a substrate;
a plurality of multi-layer structures abutted on said substrate and arranged separately from each other on the substrate, wherein each of the multi-layer structures is consisting of more than two insulating layers, and the refractive indices of the more than two insulating layers are consecutively increasing from a lowermost insulating layer to an uppermost insulating layer;

a buffer layer abutted on said multi-layer structures, so that said multi-layer structures are disposed between the buffer layer and the substrate, wherein the buffer layer is formed of semiconductor material;

a first conductive semiconductor layer disposed on the buffer layer, wherein the buffer layer is disposed between said multi-layer structures and said first conductive semiconductor layer;

an active layer disposed on said first conductive semiconductor layer;

a second conductive semiconductor layer disposed on said active layer; and a transparent conductive layer disposed on said second conductive semiconductor layer.

2. The optical device of claim 1, wherein said transparent conductive layer exposes a portion of a surface of said second conductive semiconductor layer.

3. The optical device of claim 2, wherein said optical device further comprises a second electrode formed on said exposed surface of said second conductive semiconductor layer and contacting with said transparent conductive layer.

4. The optical device of claim 1, wherein said optical device further comprises a second electrode formed on said transparent conductive layer, and said transparent conductive layer is disposed between the second electrode and said second conductive semiconductor layer.

5. The optical device of claim 1, further comprising a first electrode disposed on a bottom surface of said substrate wherein the substrate is located between the plurality of multi-layer structures and the first electrode.

6. The optical device of claim 1, further comprising a first electrode disposed on a surface portion of said first conductive semiconductor layer.

7. The optical device of claim 1, wherein the refractive index of each of the more than two insulating layers of said multi-layer structures is between the refractive index of the first conductive semiconductor layer and the refractive index of said substrate.

8. The optical device of claim 1, wherein a material of each of the more than two insulating layers of each of said multi-layer structures is selected from the group consisting of: $SiO_x$, $Si_xN_y$, $SiO_xN_y$, ZnSe, $TiO_2$, and $Ta_2O_2$.

9. An optical device, comprising:

a substrate;

a plurality of multi-layer structures disposed on said substrate and arranged separately from each other on the substrate, wherein each of the multi-layer structures is consisting of more than two insulating layers, and the refractive index of each of the more than two insulating layers of each of said multi-layer structures is consecutively ascending from a bottom of the more than two insulated layers of each of said multi-layer structures to a top of the more than two insulating layers of each of said multi-layer structures;

a first conductive semiconductor layer disposed on said substrate to cover said multi-layer structures, wherein the refractive indices of the more than two insulating layers of each of said multi-layer structures are between the refractive indices of the first conductive semiconductor layer and the substrate;

an active layer disposed on said first conductive semiconductor layer;

a second conductive semiconductor layer disposed on said active layer; and a transparent conductive layer disposed on said second conductive semiconductor layer.

* * * * *